(12) United States Patent
Miyasaka (10) Patent No.: US 6,291,012 B1
(45) Date of Patent: *Sep. 18, 2001

(54) METHOD FOR FORMING A METALLIC COAT BY IMPACTING METALLIC PARTICLES ON A WORKPIECE

(75) Inventor: Yoshio Miyasaka, Kasugai (JP)

(73) Assignee: Fuji Kihan Co., Ltd., Aichi (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/017,793

(22) Filed: Feb. 3, 1998

(30) Foreign Application Priority Data

| Feb. 4, 1997 | (JP) | 9-021581 |
| Apr. 8, 1997 | (JP) | 9-089262 |

(51) Int. Cl.⁷ .................. B05D 1/12; B05D 1/32
(52) U.S. Cl. .................. 427/191; 427/192; 427/198; 427/282; 427/349; 427/427
(58) Field of Search .................. 427/475, 191, 427/192, 272, 287, 427, 328, 282, 198, 349

(56) References Cited

U.S. PATENT DOCUMENTS

| 2,618,572 | 11/1952 | Parrish | 117/31 |
| 2,618,574 | * 11/1952 | Parrish . | |
| 3,100,724 | * 8/1963 | Rocheville . | |
| 3,754,976 | * 8/1973 | Babecki et al. . | |
| 3,996,398 | 12/1976 | Manfredi | 427/191 |
| 4,049,857 | * 9/1977 | Hammer | 428/136 |
| 4,120,997 | * 10/1978 | Franks et al. . | |
| 4,552,784 | * 11/1985 | Chu et al. | 427/192 |
| 4,666,743 | 5/1987 | Ohta et al. | 427/265 |
| 5,087,486 | * 2/1992 | DeVos et al. | 427/264 |
| 5,302,414 | * 4/1994 | Alkhimov et al. | 427/192 |
| 5,330,790 | * 7/1994 | Calkins | 427/204 |
| 5,494,520 | 2/1996 | Lamendola et al. | 118/608 |

FOREIGN PATENT DOCUMENTS

| 901571 | 7/1985 | (BE) . |
| 330 917 | 12/1920 | (DE) . |
| 473 681 | 3/1929 | (DE) . |
| 0 556 065 A1 | 8/1993 | (EP) . |
| 2 045 285 A | 10/1980 | (GB) . |
| 60056060 | 4/1985 | (JP) . |
| 62-278224 | 12/1987 | (JP) . |
| 8-333671 | * 12/1996 | (JP) . |

OTHER PUBLICATIONS

Alkhimov, A. P. et al., "A method of "cold" gas–dynamic deposition", Institute of Theoretical and Applied Mechanics, Sov. Phys. Dokl. 35(12), (Dec. 1990), pp. 1047–1049.

Kharalamov, Y.A., et al., "Effect of the hardness of steel components on the bonding strength of detonation–gas coatings", 2390 Welding International 6(1992) No. 3, Abington, Cambridge, GB, pp. 229–232.

Tokarev, A. O., "Structure of Aluminum Powder Coatings Prepared by Cold Gasdynaic Spraying", Metal Science and Heat Treatment, vol. 38, Nos. 3–4, 1996, pp. 136–139.

Database WPI, Section CH, Week 9612, Derwent Publication Ltd., London, GB; Class M13, An 96–114825, XP002096549 & RU 2 038 411 C (Petrovskii Treid Khaaus Enterp), Jun. 27, 1995, Abstract.

* cited by examiner

Primary Examiner—Fred J. Parker
(74) Attorney, Agent, or Firm—Dennis G. LaPointe; Mason & Assoc., P.A.

(57) ABSTRACT

Method for forming metallic coat where, the surface of workpiece is partly covered with a masking material having a predetermined pattern, and metallic powders are ejected to the surface at the ejection velocity of 80 m/sec or higher or at the ejection pressure of 0.3 Mpa or higher by utilizing an ejection apparatus such as blast work apparatus, in order to easily attain the metallic coat having high adhesion strength without washing process, nor heat process by a relatively simple facility.

10 Claims, 5 Drawing Sheets

METHOD FOR FORMING A METALLIC COAT BY IMPACTING METALLIC PARTICLES ON A WORKPIECE

BACKGROUND OF THE INVENTION

1. Field of the Invention

This invention generally relates to a method for forming metallic coat or layer on the surface of workpiece. More concretely, this invention relates to a method for forming metallic coat which can be applied in various kinds of technical field, e.g. forming of printed circuit, ceramic, ceramics, ceramic product, metal tableware, several kinds of thermosetting resin molding product, surface decoration for a paper and the like having at least enough thickness to allow the ejection of metal powders without making a through hole thereon.

Further, this invention relates to a method for forming metallic coat on the surface of workpiece at its predetermined part, and for nitriding in general meaning including soft nitriding the surface of workpiece at its rest part, by coating the above predetermined part with the metallic coat formed by the above method, before nitriding, so that the above coated predetermined part is prevented from being subjected to nitriding.

2. Description of the Prior Art

In many technical fields, it is common to form metallic coat having a predetermined pattern on the surface of workpiece. For example, on the surface of ceramic product, metallic coat made of gold, silver and the like is formed with a predetermined pattern as surface decoration. As another example, on the surface of ceramic substrate, metallic coat is formed with a predetermined pattern for forming a printed circuit.

For forming the metallic coat in the above variety of technical fields, there are several methods. For example, there is a method comprising: forming metallic coat on the surface of workpiece by some operations including first painting, electroplating and the like; and reacting the metallic coat with chemicals so that abrasion occurs there for etching with a predetermined pattern. Alternatively, there is another method comprising: painting a paste, which contains metallic powders as coating material and solvent, on the surface of workpiece with a predetermined pattern by screen process printing, dipping the workpiece after masking, transcripting with a transfer paper, or the like; melting the metallic powders contained in the paste by heating this paste and fixing the metallic powders to the surface of workpiece so that metallic coat with a predetermined pattern is formed; washing the workpiece so that the solvent which has been emerged due to heating is removed; and obtaining a product on which the metallic coat having the pattern according to the shape of the above painted paste was formed. Addition to these methods, a vacuum deposition method also can be used.

In the above conventional methods, by the method where the metallic coat is formed by merely painting, adhesion is too low. Further, by the other conventional method where the metallic coat formed by electroplating or the like is subjected to etching, several kinds of chemicals are required during the etching, and long time and high cost are required for forming the coat and for the etching. By the vacuum deposition method, although high adhesion can be obtained, high cost is required like baking method. Further, the utilization of products obtained by this vacuum deposition method is limited.

On the other hand, by the conventional method where the coat is formed by painting the above paste containing the above metallic powders, the pattern of formed metallic coat can be determined during painting of paste, i.e., the predetermined pattern can be formed without any process such as etching. However, in order to obtain the predetermined pattern precisely, this conventional method requires other many processes such as painting of paste, fixing of metallic coat by means of heating, washing of solvent and the like. Further, when the metallic coat is fixed due to heating as stated before, the solvent contained in the paste and metallic powders are partly evaporated and released in the air, resulting in that the working environment becomes worse. Particularly, when solder coat is formed, since lead contained in the solder is evaporated, a problem is caused. Precisely, if large amount of evaporated lead is breathed by a human, it is feared that his or her health condition might be damaged. Accordingly, if metallic coat is formed by such method, the working environment must be carefully prepared.

Additionally, in order to retain the metallic powders just in the pattern of paste painted on the surface of workpiece, the various conditions, e.g., the viscosity of paste, the kind of solvent, the particle size of metallic powder, temperature to which the paste is heated, must be determined optimally. However, this determination is so difficult.

Moreover, when the solvent and the equivalents, which have been emerged on the surface of workpiece, are washed, a washing agent containing many kinds of chemicals is required. Further, after washing, the washing agent contains the metallic powders and solvent, which have been removed from the surface of workpiece by washing, hence, such washing agent can not be discharged into river and the like as it is. Therefore, facilities must be provided in order to clean and neutralize the agent, resulting in a problem.

A problem which is common in the foregoing conventional methods is as follows. Precisely, products particularly ones made of ceramics, on each surface of which metallic coat having a predetermined pattern is formed by the conventional methods, lose their inherent mechanical strength against usual utilization, usual use, repeated washing and the like. Additionally, each product does not have sufficient peel strength (particularly, water resistance peel strength). Further, it has been known that stress corrosion often occurs on ceramics. Then, since a glass layer is included in the ceramics as a grain boundary layer, stress corrosion is caused by not only acid and alkali but also moisture. This stress corrosion progresses so quickly that the ceramics is affected by even vapor in the air. Also in a crystalline having an Al—O bond, stress corrosion caused from moisture is found as "Fatigue" or "Slow Crack Growth".

Engraving as decoration on each conventional glass product has been performed typically by cutting with grinder or the equivalent, sandblasting, etching with chemicals, or the like. However, in every case, since irregularity remains as cracks on the surface of workpiece, the glass product is easily broken by increasing stress corrosion caused from external factors.

There are some metallic work materials, in each of which, it is required that the part of its surface is subjected to nitriding, but the other part of surface is not subjected to nitriding so as to be remained as it is. Accordingly, in order to prevent nitrogen from dispersing at the part where the nitriding is not required, this part is plated before the nitriding. By doing so, this plated part is prevented from being subjected to nitriding. There are several methods for preventing the nitriding in this way.

In these methods, there is a method where hot-dipping is used for preventing the nitriding. In this method, the work material should be dipped in heated and melted metal, thus, such operation is dangerous. Additionally, the excessive amount of metal adhered to the surface of work material must be removed, which requires long time.

Further, heated and melted metal is required for the dipping, thus, a facility for heating the metal is necessary in order to maintain its melting state. This causes the problem of high cost.

Moreover, since the adhesion of plating layer formed by using the hot-dipping is small, the plating layer is easily peeled from the surface of work material. Accordingly, many substandard products are produced. This is the reason why the cost of each product formed by using the hot-dipping is increased.

Alternatively, there is a method where electroplating is used for preventing the nitriding. However, this method requires long time until the metal is deposited on the surface of work material and plating is formed. Further, if the plating is required to be fine, electro-deposition should be performed at low voltage. Accordingly, this electroplating method requires much longer time. That is to say, due to the long plating operation, this method has the problem of high cost.

Then, when welding or the like is performed on the work material which has been subjected to nitriding, the plating must be peeled at parts where the welding is to be performed. However, if the plating is made of nickel, this plating formed by the above method using electroplating can not be peeled easily from the surface of work material. Therefore, a release agent such as caustic soda is required. Accordingly, the facility for treating the release agent is necessary, resulting in high cost for its maintenance and management.

The present invention has been developed for solving the problems existing in the above conventional technique. The object of the present invention thereby is to provide a metallic coat forming method, by which no washing process for solvent or the like is required by needlessness of such solvent or the like in order to form the metallic coat ; by which work environment and peripheral environment can be prevented from becoming worse by needlessness of heat process or the like in order to form the metallic coat having high adhesion; and by which the metallic coat with a predetermined pattern can be easily formed at low cost with a relatively simple equipment or facility.

Another object of the present invention is to provide a metallic coat forming method particularly for prevention of nitriding. In this method, the metallic coat, which has high density as well as high strength of adhesion to the surface of work material and which can be easily peeled from the surface of work material after nitriding, is formed on the surface of work material at its part where the nitriding should be prevented, so that the nitrogen can be surely prevented from dispersing in the part on which the metallic coat has been formed, during the nitriding of work material.

SUMMARY OF THE INVENTION

In order to attain the above objects, the method of the present invention is characterized by the following. In accordance with one aspect of the present invention, the method for forming metallic coat comprising: covering the surface of workpiece W at its part with a masking material having a predetermined pattern; and ejecting metallic powders 15 as the material of coat 14 at the ejection velocity of 80 m/sec or higher or at the ejection pressure of 0.3 Mpa or higher by utilizing an ejection apparatus such as blast work apparatus. As the workpiece W, are used a metallic work product, ceramic manufacture, metal tableware, printed circuit, circuit substrate, several kinds of thermosetting resin molding product, paper which has at least enough thickness to allow ejection of metal powders without making a through hole on the paper, paper made of specific material including first synthetic paper, and the like. As the metallic powder, are used gold, silver, copper, tin, lead, solder and the like.

In accordance with another aspect of the present invention, the method for forming metallic coat comprising: covering the surface of workpiece at its part with a masking material having a predetermined pattern; cutting the surface according to the above predetermined pattern by sandblasting; and ejecting metallic powders as the material of coat, while the part of surface can be remained to be covered with the masking material.

In accordance with further another aspect of the present invention, the method for forming metallic coat comprising: covering the surface of workpiece at its part with a masking material having a predetermined pattern; cutting the surface according to the predetermined pattern by sandblasting; and ejecting the metallic powders, after the masking material is removed. In this method, the large thickness of metallic coat can be formed on the surface on which sandblasting has been performed, on the other hand, small thickness of metallic coat can be formed on the surface which is covered by the masking material. Thus, stereoscopic vision as well as light and shade of color can be expressed on the engraved surface.

The workpiece W is preferably the metallic work product; thermosetting resin molding product, paper, all of which are mentioned above. Addition to them, glass, porcelain, or variety kinds of ceramic product are also used preferably as the workpiece W.

The metallic powders 15 used in the present invention has the average particle size of 20 to 300$\mu$, preferably, 20 to 100$\mu$, and more preferably, 40 to 80$\mu$. If the glass article is used, the most preferable thickness is 30 to 60$\mu$. If the work material W is metal, as the metallic powder 15, several kinds of metal each having lower melting point and lower hardness than those of the metal of work material, eg., tin can be used. If the work material W is thermosetting resin, as the metallic powder 15, metal such as lead, tin, and the like can be used.

In accordance with another aspect of the present invention, the method for forming metallic coat for prevention of nitriding comprising: preferably after covering the surface of work material of metallic work product, at the part of surface where nitriding should be prevented, with a masking material having a predetermined pattern, ejecting various kinds of metallic powders to the surface of work material so that the metallic powders are deposited to the surface at the other part and the metallic coat was formed there; and subjecting the partly metal coated work material to nitriding. In this method, the metallic powder should be tin (Sn), aluminum (Al), and the like, which have lower melting point and lower hardness than those of the above work material. In this method, metallic coat is formed for the prevention of nitriding for the part of surface of work material.

BRIEF DESCRIPTION OF THE DRAWINGS

The object and advantages of the invention will become understood from the following detailed description of preferred embodiments thereof in connection with the accompanying drawings in which like numerals designate like elements, and in which.

DETAILED DESCRIPTION OF THE PREFERRED EMBODIMENT

Now, the embodiment of the present invention is explained in connection with the accompanying drawings.

The method for forming metallic coat 14 of the present invention comprises ejecting metallic powders 15 as the material of coat to the surface of workpiece W at the ejection velocity of predetermined value or higher or at the ejection pressure of predetermined value or higher so that the ejected powders 15 are adhered to the surface of workpiece W in order to form the metallic coat 14.

As the ejected metallic powder 15, gold, silver, copper, tin, solder powder (alloy of Pb and Sn), zinc, aluminum and the like can be used. The average particle size is preferably 20 to 100$\mu$, more preferably, 40 to 80$\mu$. The shape of metallic powder is not limited but can be variety of shapes such as sphere, polygon, or the like. However, the shape is preferably sphere, because, it is difficult to polish the surface of workpiece W with spherical shaped powders.

As the ejected metallic powder 15, variety of metals each having the lower melting point and lower hardness than those of work material W can be used. However, if zinc (Zn) is used as the powder, the above mentioned nitriding prevention can not be effected. Nickel (Ni) is one of metals which cause difficulty in forming of coat depending on the material of workpiece W. On the other hand, tin (Sn) is preferable to be used, because it can be used over a wide range of material of workpiece. Aluminum (Al) is sometimes unsuitable, because explosion night occur when aluminum powders are ejected with compressed air.

Tin coat 14, which has been formed by the ejection of tin (Sn), can be easily peeled from the surface of workpiece by sandblasting performed on the tin coat after the nitriding. Thus, when the workpiece should be welded after nitriding, it is easy to remove the tin coat 14 at the part which is to be welded.

There are many kinds of apparatus which can eject the above metallic powders 15 at the predetermined ejection velocity or the predetermined ejection pressure. Concretely, centrifugal blast work apparatus, which ejects the metallic powders 15 by utilizing centrifugal force; flat blast work apparatus, which ejects the metallic powders 15 by shooting the powders; air blast work apparatus, which ejects the metallic powder 15 together with the flow of compressed air; and the like can be used. In the embodiment of the present invention, the air blast work apparatus is used, because in this air blast apparatus, it is easy to adjust ejection velocity, ejection pressure, ejection range of metallic powders 15, and the like.

Particularly, among the several kinds of air blast work apparatus stated above, a straight hydraulic blast apparatus, where compressed air is supplied into a tank containing the metallic powders 15, the powders 15 are carried by the compressed air, then the powders 15 are placed on the flow of other compressed air so as to be ejected from a blast gun 40, is used in the embodiments of the present invention. Additionally, a gravity blast apparatus, where metallic powders 15 are fallen due to gravity and placed on compressed air so as to be ejected, is also used in the embodiments of the present invention. However, it is needless to say that as this ejection apparatus, other blast apparatuses can be used in the embodiments of the present invention. For example, there is a siphon blast work apparatus, where the metallic powders 15 are sucked due to negative pressure generated by the ejection of compressed air and the powders 15 are ejected together with the compressed air.

Figure 4:
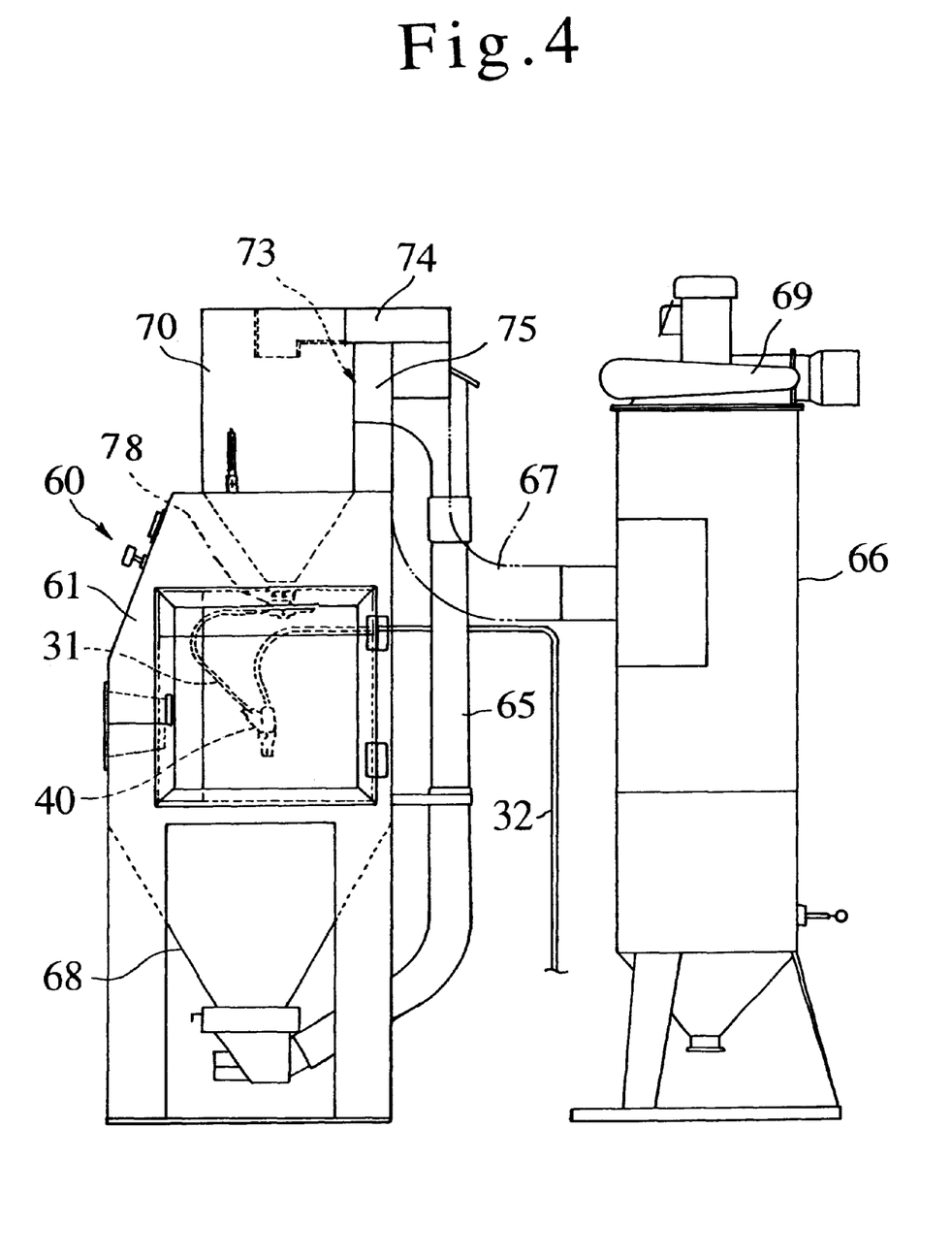
FIG. 4 is a front view showing one example of blast work apparatus used in the method in accordance with the present invention.
Figure 5:
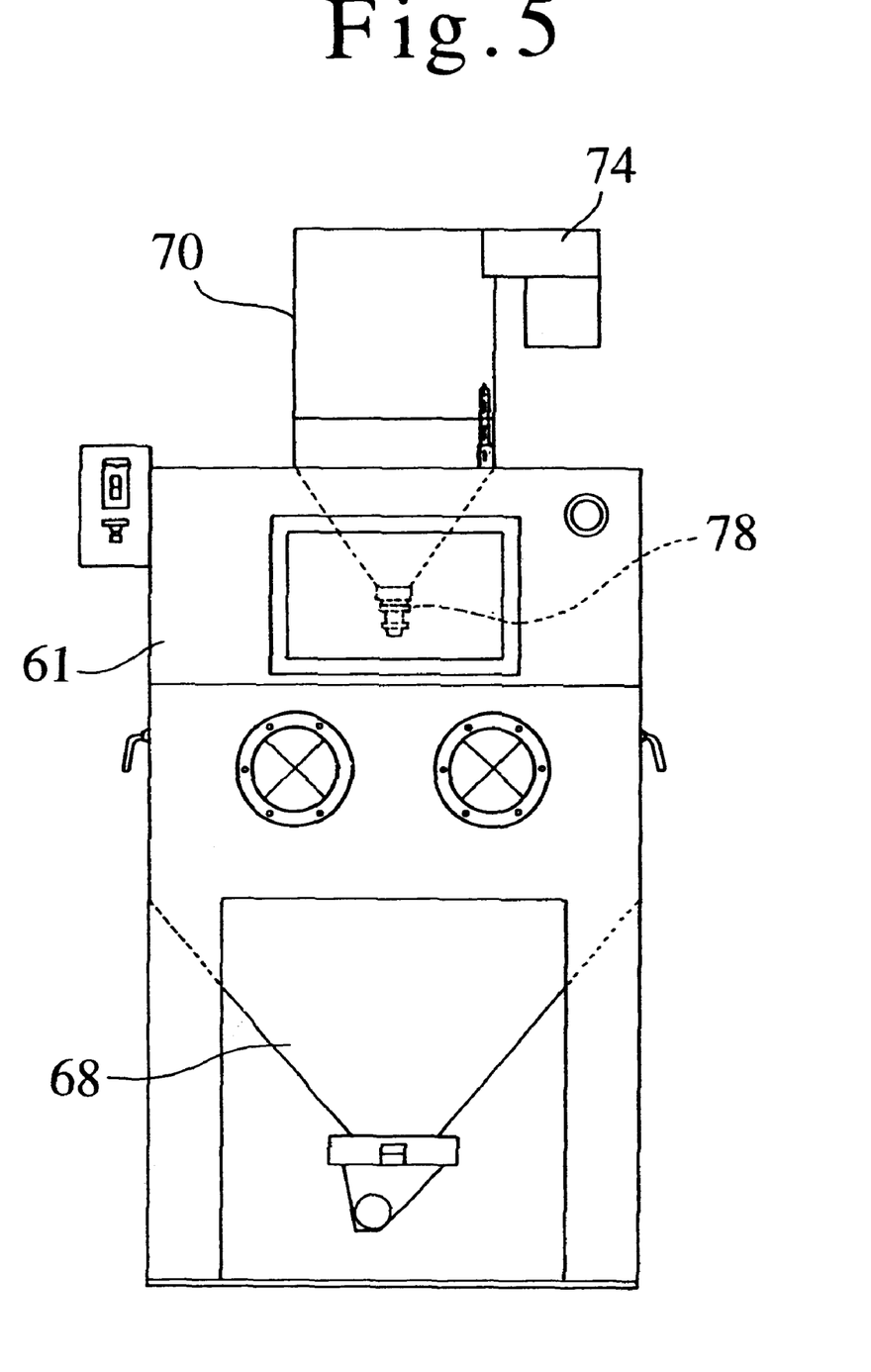
FIG. 5 is a left side view of the blast work apparatus shown in FIG. 4.

As one example of ejection apparatus of metallic powder 15 used in the method in accordance with the present invention, the gravity blast apparatus is shown in FIGS. 4 and 5.

Now, the general composition of blast work apparatus 60 served as the apparatus for ejecting metallic powders 15 is explained. In FIGS. 4 and 5, a cabinet 61 is equipped with a gate through which the workpiece W is fed into and out from the cabinet. In the cabinet 61, a blast gun 40 is provided for ejecting the metallic powders 15 to the workpiece W which is fed into the cabinet 61 through the above gate.

Then, a hopper 68 is provided below the cabinet 61. Then the lowest part of hopper 68 is communicated, through a conduit 65, with the upper portion of recovery tank 70, which recovers the metallic powders 15.

The recovery tank 70 is generally a cyclone, an apparatus which separates dusts from the metallic powders 15. As shown in FIG. 4, the recovery tank 70 comprises a cylindrical portion, which has the shape of cylinder and which is provided at the upper portion of the recovery tank 70, and a conical portion, which has the shape of cone tapered gradually toward its bottom and which is provided at the lower portion of the recovery tank 70. An inlet 73 is provided on the side wall of upper portion in the cylindrical portion of recovery tank 70. Then, the tip end of the above conduit 65 is connected, through a communicating pipe 75, to the inlet 73.

The axial direction of the above communicating pipe 75 is tangential to the inner wall of cylindrical portion and has the shape of branch on the cross section of cylindrical portion, thus, gas flow introduced into the recovery tank 70 from the communicating pipe 75 is brought down while it moves spirally along the inner wall of cylindrical portion.

A regulator 78, which regulates the amount of ejection of metallic powder 15 from the blast gun 40, is fixed at the lower end of conical portion of recovery tank 70. The blast gun 40 is communicated with the regulator 78. On the other hand, a connecting pipe 74 is fixed to the substantial center of the uppermost wall of recovery tank 70. The connecting pipe 74 is communicated, through an discharging pipe 67, with a dust collector 66.

In the dust collector 66, an exhauster 69 is rotated so that the air contained in the dust collector 66 is exhausted. Further, this exhauster 69 sucks the air contained in the cabinet 61, conduit 65, and recovery tank 70 of blast work apparatus 60, causing negative pressure in these parts 61, 65, 70, respectively. At the same time, air, which has been supplied from a compressed air supply source (not shown), is ejected from the blast gun 40 together with metallic powder 15. As a result, gas flow passes from the cabinet 61 to a conduit 65, recovery tank 70 and dust collector 66 in this order.

The workpiece W, on which the metallic coat 14 is to be formed, is introduced into the cabinet 61 of blast work apparatus 60 having the construction explained above and the metallic powders 15 are ejected to the surface of workpiece W at the ejection velocity of 80 m/sec or higher, or at the ejection pressure of 0.3 Mpa or higher.

As the workpiece W, which is to be worked according to the method of the present invention, various kinds of material such as metal, glass, resin product can be used. It is preferable that the workpiece W is glass, porcelain, various kinds of ceramic product, because, they may not be cut by the impact force caused by impingement of ejected metallic powders 15 and the surface of workpiece, and they may not be deformed by heat generated caused by their ejected impingement, whereby, the metallic coat can be easily formed by their impingement.

If the surface of workpiece W is previously ground with abrasives such as silicon carbide (SiC) abrasive grains, the metallic coat 14 can be adhered surely and high strength of adhesion can be obtained.

The metallic powders 15 are ejected at the above ejection velocity or above ejection pressure to the surface of such workpiece W and adhered there due to the impact force on the impingement of ejected metallic powders 15 and the surface of workpiece W, and due to the heat generated by their impingement. As a result, the metallic coat 14 made from the metallic powders 15 is formed on the surface of workpiece W.

The thickness of this metallic coat can be determined so as to be desired value in the range of about 0.2 to 15 $\mu$m by adjusting ejection velocity or ejection pressure and ejection time. Thus, the metallic coat 14 having the high strength of adhesion to the workpiece W can be obtained.

Figure 1:
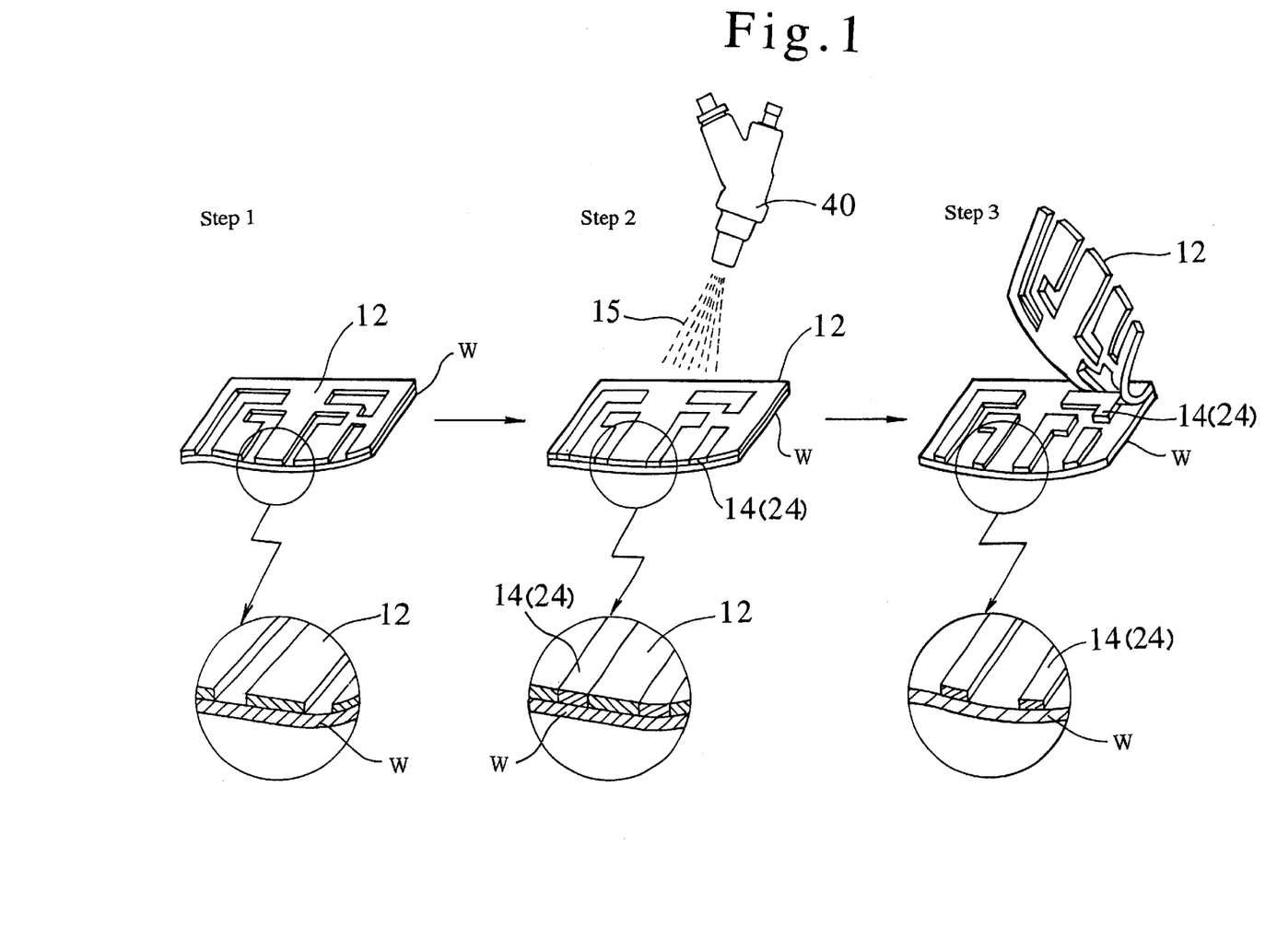
FIG. 1 is a drawing of steps showing one example in accordance with the present invention.

FIG. 1 shows the method for forming the metallic coat 14 according to the predetermined pattern in the present invention. This method comprises the step (step 1 of FIG. 1), where, the surface of workpiece W is covered at its part with a masking material 12 so that the metallic coat 14 is to be formed on the surface at its other part; the step (step 2 of FIG. 1), where, the metallic powders 15 are ejected to the partly masked workpiece W for forming the metallic coat 14; and the step (step 3 of FIG. 1), where, the masking material 12 are peeled or washed so as to be removed from the surface of workpiece W.

The method for masking the surface of workpiece W is explained. When a predetermined pattern is not fine nor is it complicated, a resin film or tape, on which adhesive is applied, is used as the masking material. In this case, the film or tape is stuck on the surface of workpiece W at its part where the metallic coat 14 is not to be formed. However, in order to form the metallic coat 14 so as to accord to the pattern precisely, there are several methods as follows: a masking material 12 made of rubber, resin or the like is directly printed on the surface of workpiece by screen process printing; a masking material 12 which is printed on a transfer paper is transferred to the surface of workpiece W; and applying known lithography technique by utilizing photoresist or the like (Step 1).

When the metallic powders 15 are ejected to the surface of workpiece W, which has been thus covered with the masking material in the manner stated above, the metallic powders 15 impinged to the surface at its other part which is not covered by the masking material are adhered to the surface due to the impact force on the impingement of ejected metallic powders 15 and the surface of workpiece W, and due to the heat generated by their impingement so that the metallic coat is formed on the surface at its other part. (Step 2)

After the metallic coat having the predetermined pattern is formed on the surface of workpiece in this way, the masking material 12 is peeled or washed so as to be removed from the surface of workpiece. Thus, the metallic coat having the predetermined pattern is formed on the surface of workpiece. (Step 3)

The metallic coat which is formed in this way, can be applied to various kinds of field such as surface decoration of ceramic product, metallic tableware, and so on; forming of printed circuit on substrate; and the like.

EXAMPLE TESTS

Now, example tests, where metallic coats made of several kinds of material are formed on the surface of workpiece by means of the method in accordance with the present invention, are explained.

Example Test 1

A ceramic board having the size of 100 mm long×80 mm wide×0.8 mm thick was used as the workpiece W. To the surface of this workpiece W, copper particles are ejected so as to form the copper coat on this surface. The conditions for working used in this example test are shown in Table 1.

TABLE 1

| Conditions for Forming Copper Coat | |
| --- | --- |
| Blast Work Apparatus | Straight Hydraulic Blast Apparatus |
| Workpiece | Ceramics ($Al_2O_3$) |
| Treated Area | 100 × 80 mm |
| Metallic Powder | Copper: Average Particle Size 80 $\mu$: Polygonal Shape |
| Ejection Pressure | 0.5 Mpa |
| Nozzle Diameter | $\phi$ 5 mm |
| Ejection Distance | 200 mm |
| Ejection Time | 30 seconds |

*In the above Table, "Ejection Distance" designates the distance between the nozzle and the surface of workpiece. (This is to be repeated in the following.)

In the above process, the copper coat having the thickness of about 3$\mu$ was formed. The thickness of copper coat was substantially uniform on the treated surface of ceramic board. Further, high strength of adhesion of copper coat could be obtained.

Example Test 2

A ceramic board having the size of 100 mm long×80 mm wide×0.8 mm thick was used as the workpiece W. To the surface of this workpiece W, solder particles are ejected so as to form the solder coat on this surface.

The conditions for working used in this example test are shown in

TABLE 2

| Conditions for Forming Solder Coat | |
| --- | --- |
| Blast Work Apparatus | Gravity Blast Apparatus |
| Workpiece | Ceramics ($Al_2O_3$) |
| Treated Area | 100 × 80 mm |
| Metallic Powder | Solder (Alloy of Pb and Zn) |
| Average Particle Size | 40$\mu$: Spherical Shape |
| Ejection Pressure | 0.4 Mpa |
| Nozzle Diameter | $\phi$ 9 mm |
| Ejection Distance | 150 mm |
| Ejection Time | 20 seconds |

In the above process, the solder coat having the thickness of about 5$\mu$ was formed. The thickness of solder coat was substantially uniform on the treated surface of ceramic board. Further, high strength of adhesion of solder coat could be obtained.

Example Test 3

A ceramic board having the size of 100 mm long×80 mm wide×0.8 mm thick was used as the workpiece W. To the surface of this workpiece W, tin particles are ejected so as to form the tin coat on this surface.

The conditions for working used in this example test are shown in

TABLE 3

Conditions for Forming Tin Coat

| | |
|---|---|
| Blast Work Apparatus | Gravity Blast Apparatus |
| Workpiece | Ceramics (Al$_2$O$_3$) |
| Treated Area | 100 × 80 mm |
| Metallic Powder | Tin: Average Particle Size 40μ: Spherical Shape |
| Ejection Pressure | 0.5 Mpa |
| Nozzle Diameter | φ 9 mm |
| Ejection Distance | 150 mm |
| Ejection Time | 20 seconds |

In the above Table, "Ejection Distance" designates the distance between the nozzle and the surface of workpiece.

In the above process, the tin coat having the thickness of about 4μ was formed. The thickness of tin coat was substantially uniform on the treated surface of ceramic board. Further, high strength of adhesion of tin coat could be obtained.

Application Example

As explained above, by means of the method in accordance with the present invention, various kinds of metallic coat, which has the uniform thickness as well as high strength of adhesion, can be adhered to the surface of workpiece. Hence, the present method can be applied to the following usage.

Application 1: Forming of Printed Circuit

This application is shown by the example, where silver coat 24 having a predetermined pattern was formed on the surface of ceramic substrate as a workpiece W by means of method in accordance with the present invention, and a printed circuit was formed by utilizing the silver coat 24.

As shown in FIG. 1, in this application, the surface of ceramic substrate was covered with a masking material 12 at its part where the silver coat 24 was not to be formed. Thus, the silver coat 24 was not formed on the masked part of surface.

Then, silver powders each having the average particle size of 45μ and the shape of substantial sphere were ejected to the partly masked ceramic substrate at the ejection velocity of 200 m/sec and the ejection pressure of 0.5 Mpa for 30 seconds. Thus, the silver coat 24 having the thickness of 5μ could be obtained.

After, the above ejection of silver powders, the masking material 12 was removed from the ceramic substrate. Finally, the printed circuit made of silver coat 24 having the predetermined pattern could be obtained.

Since the silver coat 24 thus obtained was formed so as to have uniform thickness according to the masking shape, the resultant printed circuit was good one having no disconnection nor short.

Additionally, since the resultant silver coat 24 had high strength of adhesion and small thickness, the thickness of total printed circuit substrate could be small, resulting in a product having the compact size.

Application 2: Previous Treatment for Installation of Electronic Parts

In this application, on a printed circuit 19, which had been formed from silver coat with a predetermined pattern on the surface of ceramic substrate, solder coat 34 was further formed. By doing so, the printed circuit having good operability for soldering electronic parts 16 could be attained. This application shows an example, where the solder coat 34 was formed on the printing substrate on which the printed circuit had been already formed. Alternatively, it is possible that a solder coat is formed on the printed circuit, which has been formed by the above method in accordance with the present invention in the manner shown in Application 1. In this case, after the ejection of silver powders shown in the above Application 1, continuously, the solder powders are ejected. Hence, since the workpiece (substrate) is not required to be masked, the solder coat can be formed easily.

Figure 2:
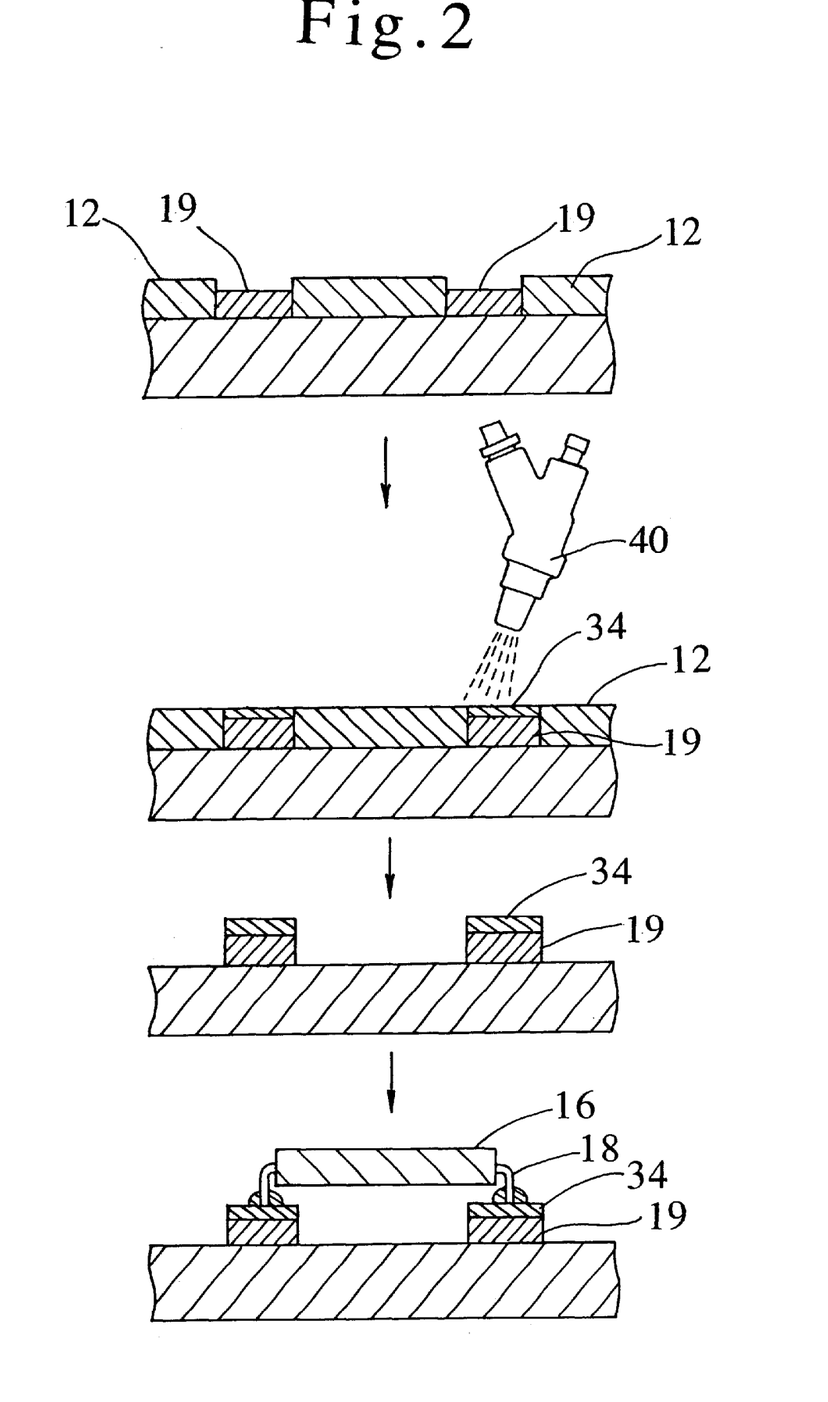
FIG. 2 is a drawing of steps showing one example of application in accordance with the present invention.
Figure 3:
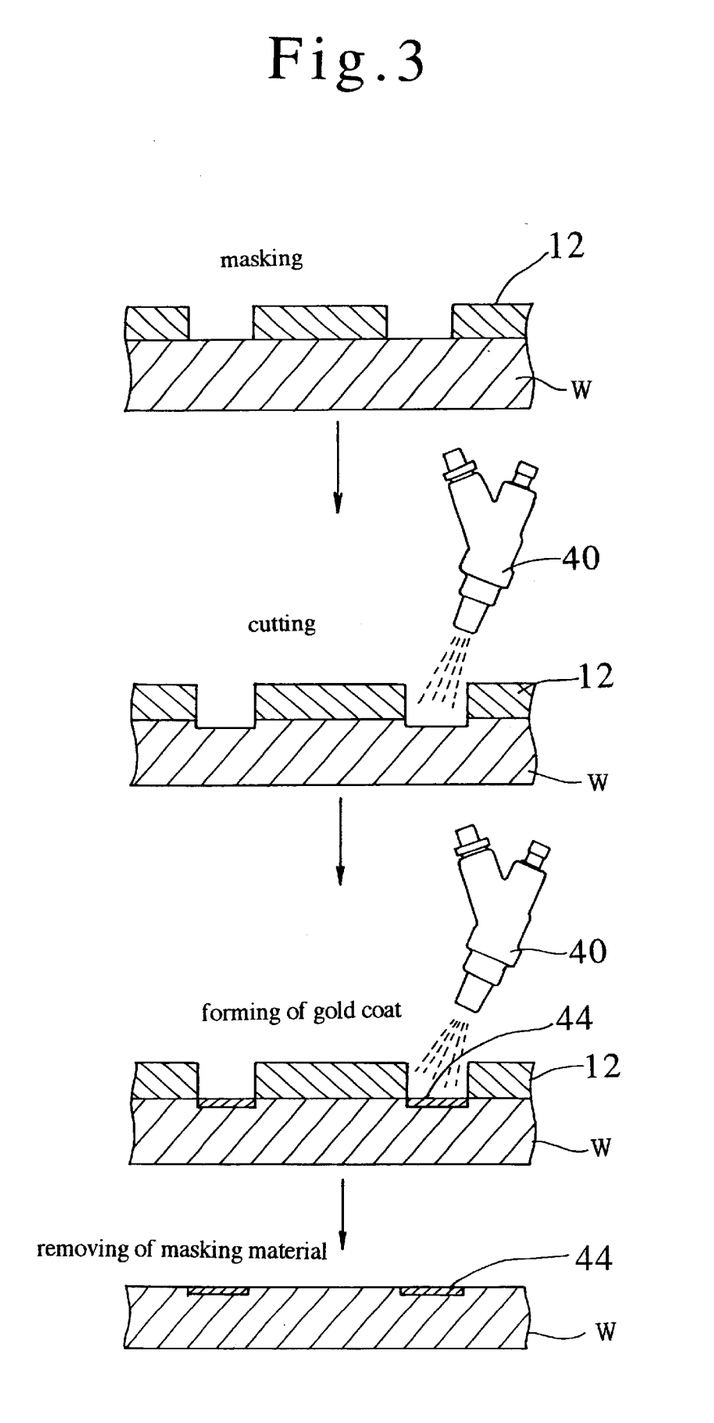
FIG. 3 is a drawing of steps showing one example of application in accordance with the present invention.

As shown in FIG. 2, the surface of workpiece was covered at the part, where the solder coat 34 is not to be formed, with a masking material 12. Then, solder powders each having the average particle size of 40μ and the shape of sphere were ejected to the surface at the ejection velocity of 100 m/sec and the ejection pressure of 0.4 Mpa for 20 seconds. Thus, the solder coat 34 having the thickness of 5μ could be formed on the printed circuit 19.

After this solder coat was formed, the masking material 12 was removed and the printed circuit 19 partly covered by the solder coat 34 could be obtained.

By contacting the lead 18 of electronic parts 16 to the solder coat 34 formed in this way, soldering could be carried out by a conventional method. Since the solder was applied easily due to the solder coat 34 formed on the printed circuit 19, paste used for the soldering was not required. Additionally, the printed circuit 19 and the lead 18 of electronic parts 16 were bonded firmly by the solder.

Likely to this application, the same treatments were carried out for silver, copper, and other kinds of printed circuit 19, resulting in good results, respectively.

Application 3: Surface Decoration on Glass, Porcelain, Ceramic Product

Gold particles were ejected on the surface of workpiece W made of glass, porcelain, ceramic so as to form gold coat 44 having a determined pattern for surface decoration of these workpieces.

In this application, the surface of each workpiece was covered at its part, where the decoration pattern was not to be formed with the gold coat 44, with a masking material. Abrasive made of silicon carbide (SiC) was ejected to the surface at its other part uncovered by the masking material in order to cut the surface of workpiece W with a predetermined depth. Then, the gold powders were ejected to the cut part for forming the gold coat 44. Thus, the pattern according to the above mask pattern could be obtained.

Conventionally, for such surface decoration, gold decoration had been performed manually. On the other hand, by the method in accordance with the present invention, the gold coat 44 can be formed simply in short time. Additionally, since the thickness of gold coat formed by the present method is small, the amount of used gold can be decreased.

Now, the embodiment of coat working for a glass product is shown.

Example 1

After sandblasting with WA powders #220, coat was formed with metallic powders stated below, and then, masking material was removed.

TABLE 4

Conditions for Forming Tin Coat

| | |
|---|---|
| Blast Work Apparatus | Gravity Blast Apparatus |
| Workpiece | Wine Glass (Crystal Glass) |
| Treated Area | 60 × 50 mm |
| Metallic Powder | Tin: Average Particle Size #350: Polygonal Shape |
| Ejection Pressure | 0.5 Mpa |
| Nozzle Diameter | φ 7 mm |
| Ejection Distance | 100 mm |
| Ejection Time | 90 seconds |

Example 2

After sandblasting with WA powders #220, masking material was removed and then, coat was formed with metallic powders stated below.

TABLE 5

Conditions for Forming Tin Coat

| | |
|---|---|
| Blast Work Apparatus | Gravity Blast Apparatus |
| Workpiece | Glass (Glass) |
| Treated Area | 80 × 50 mm |
| Metallic Powder | Tin: Average Particle Size #350: Polygonal Shape |
| Ejection Pressure | 0.55 Mpa |
| Nozzle Diameter | φ 7 mm |
| Ejection Distance | 100 mm |
| Ejection Time | 120 seconds |

The thickness of coat formed on the above blast worked surface was thick or large. On the other hand, that of coat formed on the surface covered with the masking material was thin or small. Accordingly, on the engraved (sandblast worked) surface of glass, light and shade of color as well as stereoscopic view could be expressed.

Example 3

The same treatment as that of Example 2 was performed except that a workpiece was a glass which had been subjected to grinder cutting with a diamond grindstone and that ejection time was 90 seconds. The thickness of metallic coat formed on the cut surface was large. On the other hand, that of coat formed on the other surface was small.

Example 4

First, the surface of wine glass surface was subjected, at its part uncovered with a masking material, to etching with hydrofluoric acid. Then, the same treatment as that of Example 1 was performed for forming coat. Finally, masking material was removed.

Example 5

Sandblasting was performed for a table made of tempered glass with WA powders #220. Then, coat was formed by using the following metallic powders.

Finally, a masking material was removed.

TABLE 6

Conditions for Forming Tin Coat

| | |
|---|---|
| Blast Work Apparatus | Gravity Blast Apparatus |
| Workpiece | Table (Tempered Glass) |
| Treated Area | 600 × 1200 mm |

TABLE 6-continued

Conditions for Forming Tin Coat

| | |
|---|---|
| Metallic Powder | Tin: Average Particle Size #350: Polygonal Shape |
| Ejection Pressure | 0.6 Mpa |
| Nozzle Diameter | φ 7 mm |
| Ejection Distance | 150 mm |
| Ejection Time | 20 minutes |

Example 6

Sandblasting was performed for a coffee cup (ceramic product) with SiC powders #220. Then, coat was formed by using the following metallic powders. Finally, a masking material was removed.

TABLE 7

Conditions for Forming Ag Coat

| | |
|---|---|
| Blast Work Apparatus | Gravity Blast Apparatus |
| Workpiece | Ceramic Cup |
| Treated Area | φ 60 × 50 mm |
| Metallic Powder | Ag: Average Particle Size #350: Polygonal Shape |
| Ejection Pressure | 0.7 Mpa |
| Nozzle Diameter | φ 7 mm |
| Ejection Distance | 50 mm |
| Ejection Time | 120 seconds |

Example 7

Sandblasting was performed for a black granite craft product with WA powders #220. Then, coat was formed by using the following metallic powders.

Finally, a masking material was removed.

TABLE 8

Conditions for Forming Tin Coat

| | |
|---|---|
| Blast Work Apparatus | Gravity Blast Apparatus |
| Workpiece | Black granite Craft Product |
| Treated Area | 100 × 150 mm |
| Metallic Powder | Tn: Average Particle Size #350: Polygonal Shape |
| Ejection Pressure | 0.55 Mpa |
| Nozzle Diameter | φ 7 mm |
| Ejection Distance | 100 mm |
| Ejection Time | 120 seconds |

Example Test

The same workpieces as the untreated workpieces of the above Examples 1 to 7 were prepared. Then, for each workpiece, coats were formed by utilizing painting method, baking method, electroplating method, and vacuum depositing method, respectively. The resultant coated workpieces as well as the resultant workpieces by the above Examples were left for 24 hours. As for each resultant workpiece, in order to examine the strength of adhesion and the strength of peel, cutting lines were formed in a plurality of 10×10 mm square fretwork with a razor on the surface of resultant workpiece and adhesive tape was applied so as to cover these cutting lines. Then, the tape was pulled hard. In every workpiece resulted from the conventional methods, peeling could be attained easily. On the other hand, in every workpiece resulted from the methods in accordance with the present invention, peeling could not be found at all.

It is not known clearly how coat is adhered. However, according to microscopic examination for the cross section of adhered surface, it was observed that due to heat generated by impact energy of impingement of metallic powders and glass surface by blasting, bonding surfaces or grain boundary surfaces between the coat and the surface of glass are melted and these surfaces are deposited each other like alloy. The above generated heat could be confirmed also from the fact that by tin coating, the collar of coated part was changed from silver white, which is original color of tin, to black silver.

By changing little by little the ejection time of metallic powders and the position of blast gun, the thickness of metallic coat can be changed. Accordingly, an unique effect such as gradation, which was impossible by the conventional methods, can be obtained.

Example 8

After a mask material is adhered to a workpiece; the plate made of SUS 304 (austenitic stainless steel: 18Cr-8Ni) having the size of 20 mm long×100 mm wide×5 mm thick, the tin (Sn) powders were ejected to the surface of plate.

Then, tin coat having the thickness of 5 $\mu$m was formed on it with the area of 20 mm×50 mm, and gas soft nitriding was performed. The conditions for working used in this example test are shown in Table 9.

TABLE 9

Conditions for Working (Example Test 1)

| | |
|---|---|
| Blast Work Apparatus | Gravity Blast Apparatus |
| Workpiece | SUS 304 Plate (20 × 100 × 5 mm) |
| Metallic Powder | |
| Material | Sn |
| Particle Size | Average 40 $\mu$m |
| Shape | Substantial Spherical Shape |
| Ejection Velocity | 80 m/sec or higher (Ejection Pressure: 0.5 Mpa) |
| Nozzle Diameter | $\phi$ 9 mm |
| Ejection Distance | 15.0 mm |
| Ejection Time | 20 seconds |
| Thickness of Metallic Coat | about 5 $\mu$m |
| Nitriding | Gas Soft Nitriding |

In the above method, the collar of workpieces surface at the part where nitrogen had been dispersed was changed relatively black. The part where the nitrogen was dispersed corresponds to only the part where the tin coat was not formed. Therefore, at a part where the tin coat was formed, change of color could not be found at all.

Therefore, it could be confirmed that, by forming the tin coat on the surface of workpiece by the method in accordance with the present invention, during gas soft nitriding, the surface of workpiece at its part covered by the above tin coat could be prevented properly from nitriding.

After nitriding, when the workpiece W is subjected to welding and the like, the metallic coat 14 at its part which is to be welded is usually peeled. In order to peel, by sandblasting the surface of metallic coat 14, the above metallic coat 14 can be easily peeled from the surface of workpiece W.

As stated above, this composition of the present invention provides a metallic coat forming method, by which no washing process for solvent or the like is required by needlessness of such solvent or the like in order to form the metallic coat; by which working and peripheral environment can be prevented from becoming worse by needlessness of heat process or the like in order to form the metallic coat having high adhesion strength; and by which the metallic coat with a predetermined pattern can be easily formed at low cost with a relatively simple equipment or facility.

The above metallic coat can be formed with a blast work apparatus, which is relatively cheap facility.

The metallic coat formed by the method in accordance with the present invention is relatively thin. However, its strength of adhesion is high, further, the thickness of formed coat is uniform. Additionally, it is easy to form the coat according to the predetermined pattern. Therefore, this metallic coat can be applied to variety of uses such as forming of printed circuit, surface decoration of ceramic product, metallic tableware, and the like. Further, by determining the kinds and purity of metal for coating so as not to have problem in the view of food sanitation, various kinds of tableware and cooking tool, which keep good design as craft products as well as which can be proof against usual use and washing, can be obtained.

The stress abrasion of ceramics can be prevented by the above coat so that the engraved surface can be reinforced.

Further, in the method of present invention, metallic coat, which has high strength of adhesion and high density, is formed on the surface of workpiece for short time by ejection of metallic powders, which is relatively simple method, then, the workpiece's surface is subjected to nitriding at the part, on which the above metallic coat has been formed, resulting in reliable prevention of dispersion of nitrogen on the surface of workpiece at such part.

Particularly, when tin (Sn) is used as the particles which are to be ejected, the metallic coat can be formed properly f or any material of workpiece. Therefore, by using tin, a method for prevention of nitriding can be provided for an many kinds of workpieces.

By covering the surface of workpiece at its part with a masking material, it is easy to form metallic coat on its other part of the surface. Thus, it is possible that the predetermined part of surface of workpiece can be prevented from nitriding correctly.

Further, metallic coat, which has been formed by the method in accordance with the present invention, can be easily removed by sandblasting after nitriding. Particularly, if metallic coat has been formed by ejecting tin powders, the coat can be removed much more easily.

Thus, the broadest claims that follow are not directed to a machine that is configuration a specific way. Instead, said broadest claims are in tended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is Clearly a pioneering invention. As such, the claims that follow are entitled to very broad interpretation as to protect the heart of this invention, as a matter of law.

It will thus be seen that the objects set forth above, and those made apparent from the foregoing description, are efficiently attained. Also, since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described.

What is claimed is:

1. A method for forming a metallic coat on a workpiece, comprising the step of:

covering a part of a surface of a workpiece with a masking material forming a predetermined pattern with a resultant predetermined masking height bounding areas not covered with the masking material, thereby forming a masked surface and an uncovered surface to be coated;

ejecting metallic powders having an average particle size ranging from about 20 µm to about 100 µm to form a coating onto the uncovered surface of the workpiece at one of an ejection velocity of at least 80 m/sec and an ejection pressure of at least 0.3 MPa, wherein when the metallic powders are ejected on the workpiece, a resultant increase in temperature is concentrated on the metallic powder and the surface of the workpiece, so as to cause the metallic powders to dissolve and diffuse onto a grain boundary surface of the workpiece, thereby resulting in the metallic powders being bonded to the grain boundary surface of the workpiece.

2. A method for forming a metallic coat on a workpiece according to claim 1, further comprising the step of:

cutting said uncovered surface to be coated according to said pattern by sandblasting prior to ejecting the metallic powders.

3. A method for forming a metallic coat on a workpiece according to claim 2, further comprising removing the masking material before ejecting said metallic powders.

4. A method for forming a metallic coat on a workpiece according to claim 1, wherein said workpiece is made of a substance selected from the group consisting of pottery, porcelain, glass, ceramics, metal, thermosetting resin, and paper.

5. A method for forming a metallic coat on a workpiece according to claim 2, wherein the workpiece is made of a metallic material, and further wherein said metallic powders each have a melting point and hardness blower than those of said workpiece.

6. A method for forming a metallic coat on a workpiece according to claim 5, further comprising subjecting the workpiece to nitriding after the metallic coat is formed, whereby nitriding is prevented on the part of the surface onto which the metallic powders are ejected.

7. A method for forming a metallic coat on a workpiece according to claim 6, wherein said metallic powders are made of tin (Sn) or aluminum (Al).

8. A method for forming a metallic coat on a workpiece according to claim 7, wherein said surface of said workpiece is covered with said masking material having said predetermined pattern before said metallic powders are ejected.

9. A method for forming a metallic coat on a workpiece according to claim 7, wherein said surface of said workpiece is subjected to nitriding before said metallic coat formed on said surface is removed by sand blasting.

10. A method for forming a metallic coat on a workpiece according to claim 1, wherein said metallic powders have an average particle size of 30 to 60 µm.

* * * * *

UNITED STATES PATENT AND TRADEMARK OFFICE
CERTIFICATE OF CORRECTION

PATENT NO. : 6,291,012 B1
DATED : September 18, 2001
INVENTOR(S) : Yoshio Miyasaka Page 1 of 1

It is certified that error appears in the above-identified patent and that said Letters Patent is hereby corrected as shown below:

Column 1,
Line 35, replace "several methods. For example" with -- several methods as follows. For example --.
Line 60, replace "and long time" with -- and, long time --.

Column 5,
Line 41, replace "because it can be" with -- because, it can be --.
Line 60, replace "because in" with -- because, in --.

Column 6,
Line 3, replace "40 is used" with -- is used --.

Column 8,
Line 4, replace "metallic coat which" with -- metallic coat, which --.

Column 14,
Line 52, replace "it is Clearly" with -- it is clearly --.

Column 16,
Line 9, replace "hardness blower" with -- hardness lower --.

Signed and Sealed this

Thirtieth Day of April, 2002

*Attest:*

*Attesting Officer*

JAMES E. ROGAN
*Director of the United States Patent and Trademark Office*